(12) United States Patent
Chen et al.

(10) Patent No.: US 7,919,785 B2
(45) Date of Patent: Apr. 5, 2011

(54) PHOSPHOR FOR WHITE LIGHT-EMITTING DIODES AND FABRICATION OF THE SAME

(75) Inventors: Teng-Ming Chen, Hsinchu (TW);
Chun-Kuei Chang, Kaohsiung (TW)

(73) Assignee: National Chiao Tung University, Hsinchu (TW)

(*) Notice: Subject to any disclaimer, the term of this patent is extended or adjusted under 35 U.S.C. 154(b) by 774 days.

(21) Appl. No.: 11/879,373

(22) Filed: Jul. 17, 2007

(65) Prior Publication Data

US 2008/0283857 A1 Nov. 20, 2008

(30) Foreign Application Priority Data

May 14, 2007 (TW) .............................. 96116978 A

(51) Int. Cl.
*H01L 33/00* (2010.01)
(52) U.S. Cl. ............. 257/98; 257/E33.061; 252/301.4 R
(58) Field of Classification Search ............... 257/98, 257/E33.061; 252/301.4, 301.4 R, 301.4 H, 252/301.4 F
See application file for complete search history.

(56) References Cited

U.S. PATENT DOCUMENTS

| 5,231,328 A * | 7/1993 | Hisamune et al. ............ 313/487 |
| 5,998,925 A | 12/1999 | Shimizu et al. |
| 2005/0156496 A1* | 7/2005 | Takashima et al. ........... 313/237 |

FOREIGN PATENT DOCUMENTS

JP 60-157099 * 8/1985
JP 10056208 2/1998

OTHER PUBLICATIONS

J. Appl. Cryst. (1974), 7,402 Crystal Data on Calcium Borate Chloride, $CA_2BO_3Cl$, J. Majling, V. Figusch, J. Corba and F. Hanic.
"The Crystal Structure of Calcium Borate Chloride $CaCl_2Ca_3(BO_3)_2$", Zak and Hanic, Acta Cryst. (1976). B32, 1784, Institute of Inorganic Chemistry, Slovak Academy of Sciences, Dubrayska cesta, 809 34 Bratislava, Czechoslovakia.

* cited by examiner

*Primary Examiner* — Thomas L Dickey
*Assistant Examiner* — Fazli Erdem
(74) *Attorney, Agent, or Firm* — Bucknam and Archer

(57) ABSTRACT

The present invention provides a light-emitting diode-converted phosphor compound having the following chemical formula:

$$(M_{1-m-n}Ce_mEu_n)_2BO_3X$$

wherein M is at least one element selected from the group consisting of Ca, Sr and Ba, X is at least one element selected from the group consisting of Cl and Br, $0 \leq m \leq 0.5$, and $0 \leq n \leq 0.5$.

12 Claims, 4 Drawing Sheets

PHOSPHOR FOR WHITE LIGHT-EMITTING DIODES AND FABRICATION OF THE SAME

FIELD OF THE INVENTION

The present invention provides a novel phosphor composition for white light source, particularly for use in light-emitting diodes, and fabrication of the same.

DESCRIPTION OF THE RELATED PRIOR ART

The use of light-emitting diode (LED) for generating white light similar to sunlight, in order to generally replace traditional lighting by fluorescent lamps, has been extensively studied as a main object in the lighting field for this century. As compared to traditional light sources, light-emitting diode is of usage life at 10 times or longer, with advantages of compact, high brightness, low cost in production and waste disposal, and environment protection. Accordingly, light-emitting diode has been considered as the light source for next generation.

Two mechanisms have been utilized by current single-chip white LED technique. First, UV-LED chip emitting wavelengths below 400 nm is used as light source to excite phosphors emitting red, green and blue (RGB) lights, which are mixed to be white light; second, blue LED chip is used to excite yellow phosphor to generate white light. In the first mechanism, a variety of phosphors with properly coordinative property and deterioration degree are necessary to control quality of white light; and in the second mechanism, it is very important to use proper yellow phosphor, and none has been known yet other than the currently used $Y_3Al_5O_{12}:Ce^{3+}$ (YAG:Ce) phosphor with yttrium aluminum garnet structure (Japan Patent Publication No. 10-56208). Further, white light has been generated conventionally by mixing luminescence with different wavelengths emitted from two or more phosphors. The use of single material capable of emitting white light shall greatly simplify production process and has been a main object in this field.

Phosphor composition, so called phosphor-converted material (phosphor-converted compositions), converts UV or blue light into visible light with various wavelengths. The color of generated light depends on specific component of phosphor composition. Phosphor composition may be single composition or mixture of two or more thereof. Only LED emitting bright white light can be used as light source. Thus phosphor composition is coated on LED to generate white light. Each kind of phosphor composition emits light with given color when excited at different wavelength. For example, phosphor composition is excited by LED emitting near UV or blue light with wavelengths at 250 nm~500 nm to emit visible lights with high intensity and brightness.

White LED is widely used for the application on lighting to replace traditional lighting. Typically, structures of white LED are divided by whether phosphor is used; whereby those use phosphor are divided into (1) blue LED-excited YAG phosphor, (2) blue LED-excited YAG phosphor and red phosphor, and (3) UV LED-excited phosphor.

Two colors visually feeling the same may actually composed of lights with different wavelength from each other. Based on the three primary colors, i.e., red, blue and green, visually various colors are exhibited by composing at various ratios, so called principle of the three primary colors. Commission Internationale de l'Eclairage (CIE) has determined equivalent unit for primary colors, and luminous flux of standard white light is defined as $\Phi r:\Phi g:\Phi b=1:4.5907:0.0601$.

As equivalent unit for primary colors is determined, color combination relationship for white light Fw is:

$$Fw=1[R]+1[G]+[B]$$

wherein R represents red light, G represents green light, and B represents blue light.

To light F with any color, color combination equation thereof is $Fw=r[R]+g[G]+b[B]$, wherein r, g and b represents coefficients of red, blue and green, respectively, determined experimentally. Corresponding luminous flux is $\Phi=680(R+4.5907G+0.0601B)$ lumens (1 m, illumination unit), wherein the ratio among r, g and b determines chromaticness (degree of color saturation), and the values determine brightness of combined color. Relationship of three primary colors r[R], g[G] and b[B] can be expressed by matrix after normalization: $F=X[X]+Y[Y]+Z[Z]=m\{x[X]+y[Y]+z[Z]\}$, wherein $m=X+Y+Z$, and $x=(X/m)$, $y=(Y/m)$ and $z=(Z/m)$. Each emitting wavelength is correspondent to specific r, g and b values. By defining sum of all values in VIS region as X, sum of g values as Y, and sum of b values as Z, then chromaticity of light emitted from phosphor can be expressed by x, y coordinate system, which is named C.I.E. 1931 Standard Colorimetric System (C.I.E. Chromaticity Coordinate). As a spectrum is measured, contribution from lights of each wavelength are calculated, then exact position on chromaticity coordinate is pointed, and color of light emitted from phosphor is thus defined.

However, the most commonly used method for producing white LED formulates white light based on complementary color principle, which comprises coating a layer of YAG phosphor on InGaN blue LED emitting at 460 nm, irradiating said phosphor with blue LED to generate yellow light complementary to the blue one, and mixing the complementary blue and yellow lights to generate visually white light based on lens principle. The cost is low since only single chip is used, however, red objects show yellowish red color when irradiated due to lack of red region in resulting spectrum, and real color rendering can not be obtained. Therefore, in order to improve and obtain better color rendering index, various red phosphor have been developed and used with YAG:Ce to mix with yellow light generated therefrom. However, as deterioration degrees of the two distinct phosphor compositions differ significantly, color shifting is easily produced and natural light is difficult to generate.

Accordingly, a unitary phosphor composition emitting highly stable white light with improved color rendering index, which is useful as phosphor layer in white. LED device as an alternative to currently used phosphor-converted compositions to further adjust color temperature and improve color rendering, is desired.

SUMMARY OF THE INVENTION

The present invention provides a novel phosphor and fabrication of the same. An object of the present invention is to provide a light source converted phosphor composition which transforms emitting wavelength from blue into yellow. The present composition comprises rare earth ion-activated haloborate compounds useful for packaging white LED emitting white light with high color saturation.

Thus, LED is provided based on the novel non-sulfide white and yellow phosphor useful for packaging white LED.

The present invention provides a phosphor comprising haloborates activated by two kinds of rare earth ions and represented by following general formula:

$(M_{1-m-n}Ce_mEu_n)_2BO_3X$ wherein M is at least one element selected from the group consisting of Ca, Sr and Ba, X is at least one element selected from the group consisting of Cl and Br, $0 \leq m \leq 0.5$, and $0 \leq n \leq 0.5$.

Under excitation by primary radiation emitted from a light-emitting device, said phosphor emits secondary radiation, wherein wavelength of the primary radiation ranges 300 nm~500 nm, and wavelength of the secondary radiation is longer than that of the primary radiation.

Further, the secondary radiation emitted from the present phosphor under excitation is mixed with the excitation light to generate high stable white light with high color rendering.

The present phosphor represented by $(M_{1-m-n}Ce_mEu_n)_2BO_3X$ is synthesized by weighing calcium oxide, boric acid, calcium chloride, cerium oxide, or europium oxide in stoichiometric proportions; mixing uniformly and charging into aluminum oxide crucibles; and heating to 700~1000° C. to proceed solid-state high-temperature sintering for 4~10 hours. Subsequently, the resulting powders are characterized by determination of excitation spectrum, photoluminescence spectrum and CIE chromaticity coordinates.

The present invention also provides a light-emitting apparatus comprising a light-emitting device emitting primary radiation with wavelengths at 300 nm~500 nm, and a phosphor composition capable of absorbing a part of the primary radiation emitted from said light-emitting device to emit secondary radiation which wavelength is different from that of the primary radiation; wherein said phosphor composition is represented by following general formula:

$(M_{1-m-n}Ce_mEu_n)_2BO_3X$ wherein M is at least one element selected from the group consisting of Ca, Sr and Ba, X is at least one element selected from the group consisting of Cl and Br, $0 \leq m \leq 0.5$, and $0 \leq n \leq 0.5$.

DETAILED DESCRIPTION OF THE INVENTION

The present invention is described in detail by referring to embodiments, drawings and tables, in order to facilitate a better understanding of the present components, and physical and light-emitting characteristics thereof for those skilled in this field, hence the objects, technical contents, features, and effectiveness of the present invention are more easily to be known.

The present invention provides a phosphor represented by following formula:

$(M_{1-m-n}Ce_mEu_n)_2BO_3X$ wherein M is at least one element selected from the group consisting of Ca, Sr and Ba, X is at least one element selected from the group consisting of Cl and Br, $0 \leq m \leq 0.5$, and $0 \leq n \leq 0.5$. Accordingly, the phosphor represented by the above formula comprises compositions with various molar ratios of components obtained by mixing stoichiometric amount of calcium oxide, boric acid, calcium chloride, cerium oxide, or europium oxide during synthesis.

The present phosphor represented by $(M_{1-m-n}Ce_mEu_n)_2BO_3X$ is synthesized by weighing calcium oxide, boric acid, calcium chloride, cerium oxide, or europium oxide in stoichiometric proportions; mixing uniformly and charging into aluminum oxide boat crucible; then immediately transferred to high temperature tabular furnace equipped with quartz tube, and heated at 700~1000° C. in mixed atmosphere consisting of hydrogen and argon to proceed high-temperature sintering for 4~10 hours.

Further, since the wavelength of emitted light from UV-blue LED is between 250 nm~500 nm, xenon lamp emitting light with the similar wavelength can be used for testing emitting characteristics of the present phosphor. Therefore, FluoroLog-3 Spectrofluorometer (HORIBA Jobin Yvon Spex S. A., USA) equipped with 450 W xenon lamp is used to determine both photoluminescence and excitation spectrum in the present invention.

Figure 1:
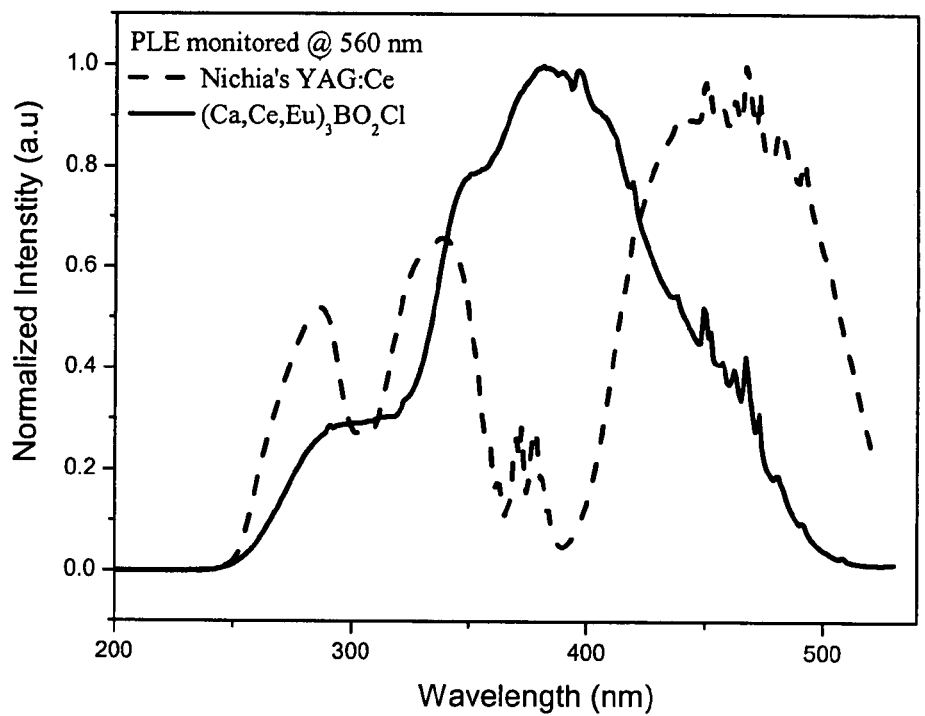
FIG. 1 shows the comparison of excitation spectrum between $(Ca_{0.99}Eu_{0.11})_2BO_3Cl$ in a preferred embodiment of the present invention and YAG:Ce phosphor from Nichia Corporation.
Figure 2:
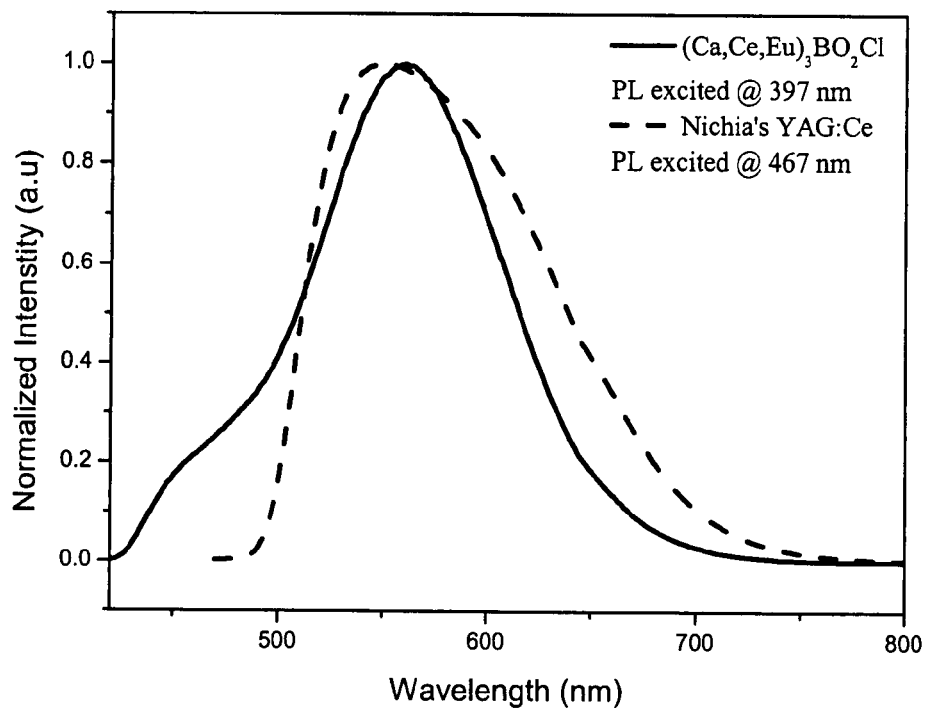
FIG. 2 shows the photoluminescence spectrum comparison between $(Ca_{0.99}Eu_{0.11})_2BO_3Cl$ in a preferred embodiment of the present invention and YAG:Ce phosphor from Nichia Corporation.
Figure 3:
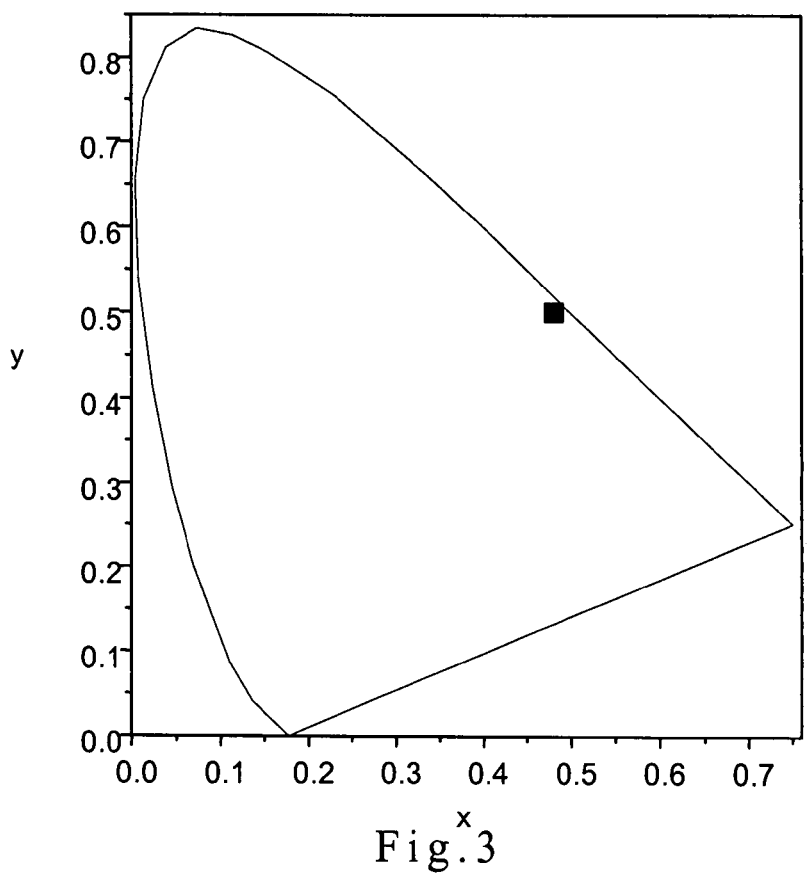
FIG. 3 shows the chromaticity coordinate of $(Ca_{0.99}Eu_{0.11})_2BO_3Cl$ in a preferred embodiment of the present invention and YAG:Ce phosphor from Nichia Corporation.

A preferred embodiment of the present is a phosphor represented by $(M_{0.99}Eu_{0.01})_2BO_3Cl$, i.e., m=0 and n=0.01 in the above formula. A comparison with that of $Y_3Al_5O_{12}$:Ce (YAG:Ce) available from Nichia Corporation, Japan was made by monitoring samples at 560 nm using Spex FluoroLog-3 Spectrofluorometer to obtain both photoluminescence and excitation spectrum. FIG. 1 shows the comparison of excitation spectra for $(M_{0.99}Eu_{0.11})_2BO_3Cl$ in the preferred embodiment of the present invention (solid line) and YAG:Ce (dash line) from Nichia Corporation. As can be seen from FIG. 1, the excitation efficiency of said phosphor is good at 350 nm~450 nm, i.e., ultraviolet and blue spectral regions. FIG. 2 shows the comparison of photoluminescence spectra for $(M_{0.99}Eu_{0.11})_2BO_3Cl$ phosphor in the preferred embodiment of the present invention excited at 397 nm (solid line) and YAG:Ce available from Nichia Corporation, Japan excited at 467 nm (dash line). As can be seen from FIG. 2, in comparison to that of YAG:Ce available from Japan Nichia Corporation, the photoluminescence spectrum of the present phosphor covers blue spectral region to have higher color rendering. FIG. 3 shows the CIE chromaticity coordinates of $(M_{0.99}Eu_{0.11})_2BO_3Cl$ phosphor excited at 350 nm~450 nm, obtained by using DT-100 Chromaticity Analyzer (Laiko Co., Japan), which corresponds to yellow light with chromaticity coordinates (0.48, 0.50) as a result.

Figure 4:
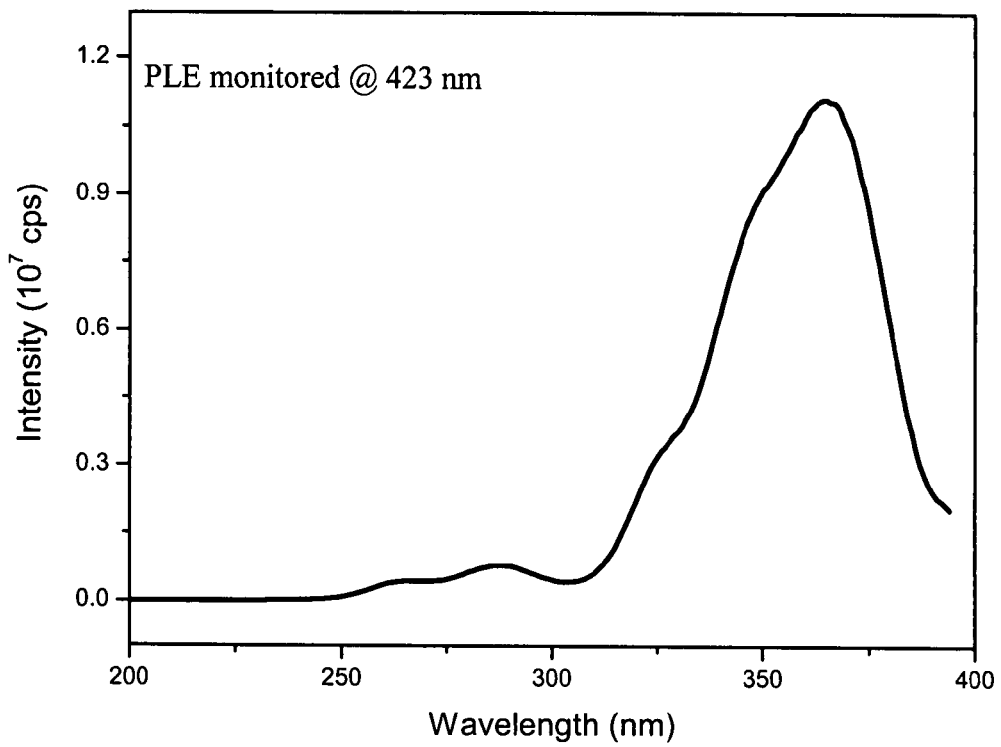
FIG. 4 shows the excitation spectrum of $(Ca_{0.987}Ce_{0.01}Eu_{0.003})_2BO_3Cl$ phosphor in a preferred embodiment of the present invention.
Figure 5:
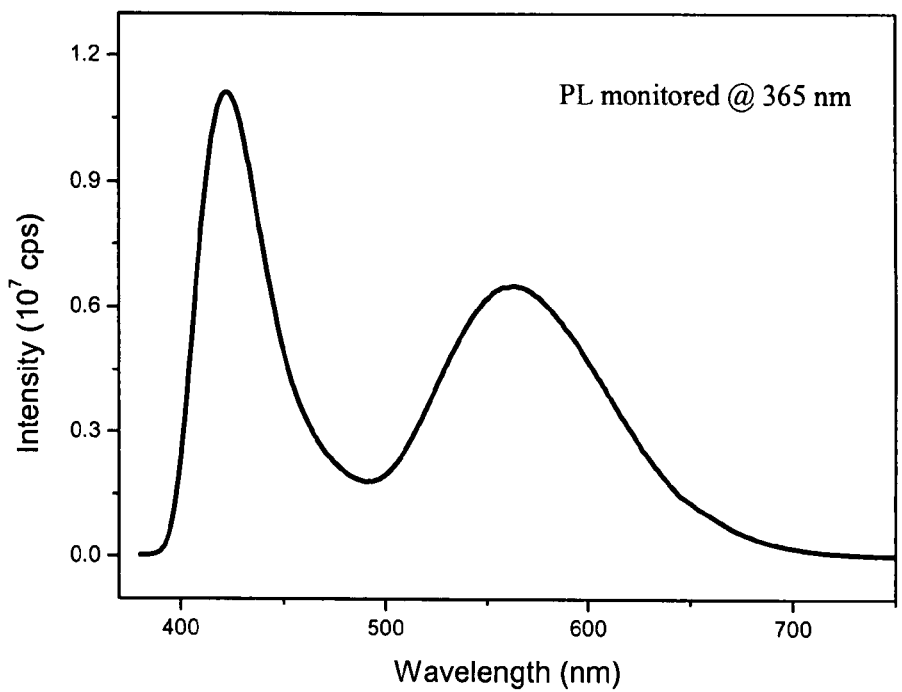
FIG. 5 shows the photoluminescence spectrum of $(Ca_{0.987}Ce_{0.01}Eu_{0.003})_2BO_3Cl$ phosphor in a preferred embodiment of the present invention.
Figure 6:
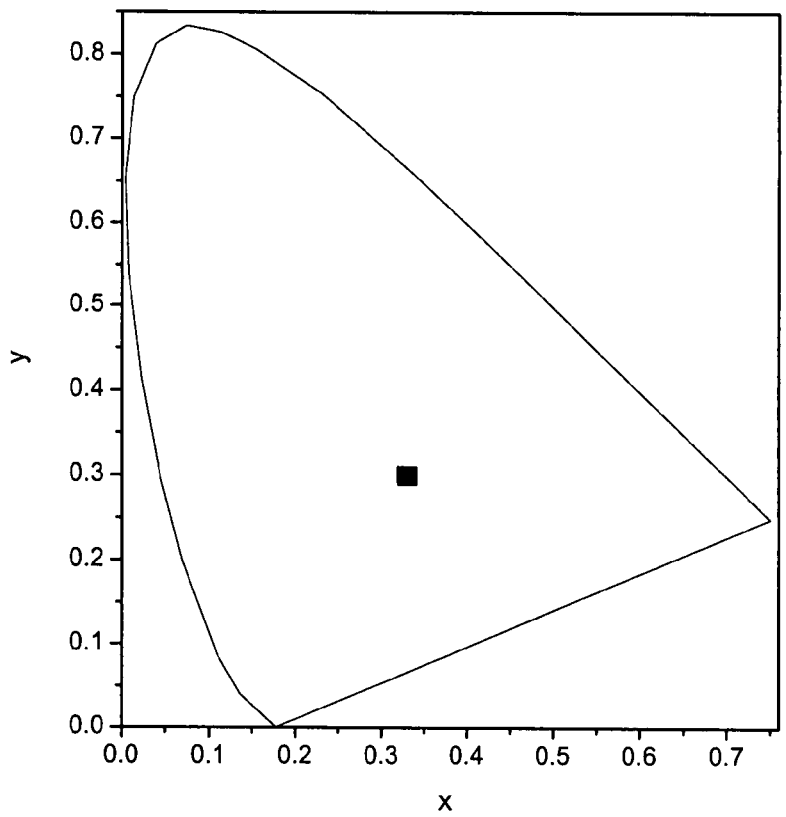
FIG. 6 shows the chromaticity coordinates of $(Ca_{0.987}Ce_{0.01}Eu_{0.003})_2BO_3Cl$ phosphor in a preferred embodiment of the present invention.

A further preferred embodiment of the present invention is $(M_{0.987}Ce_{0.01}Eu_{0.003})_2BO_3Cl$ phosphor, i.e., m=0.01 and n=0.003 in the above formula, obtained by changing the relative molar ratio of $Ce^{3+}/Eu^{2+}$ ions. FIG. 4 shows the excitation spectrum thereof monitored at 423 nm by using Spex FluoroLog-3 Spectrofluorometer. As can be seen from FIG. 4, the optimal excitation wavelength for phosphor with the given composition is 365 nm. Therefore, the photoluminescence spectrum of $(Ca_{0.987}Ce_{0.01}Eu_{0.003})_2BO_3Cl$ phosphor was excited again at 365 nm and the spectrum is shown in FIG. 5, wherein emitted blue light at 423 nm and yellow light at 560 nm are observed simultaneously. FIG. 6 shows the CIE chromaticity coordinate of said phosphor excited at 365 nm, obtained by using DT-100 Chromaticity Analyzer (Laiko Co., Japan), which corresponds to white light with chromaticity coordinates (0.33, 0.30) as a result.

A further preferred embodiment of the present invention illustrates luminescence characteristics of $(M_{1-m-n}Ce_mEu_n)_2BO_3X$ phosphors synthesized at various molar ratios of $Ce^{3+}/Eu^{2+}$ ions. The CIE chromaticity coordinates of said phosphors excited at 365 nm were obtained by using DT-100 Chromaticity Analyzer (Laiko Co., Japan). The resultant chromaticity coordinates of said phosphors having seven different compositions are shown in Table 1.

TABLE 1

| Content of $Ce^{3+}$ (m) | Content of $Eu^{2+}$ (n) | CIE chromaticity coordinate (x, y) |
|---|---|---|
| 0.01 | 0 | (0.17, 0.09) |
| 0.01 | 0.001 | (0.33, 0.29) |
| 0.01 | 0.003 | (0.33, 0.30) |
| 0.01 | 0.005 | (0.36, 0.32) |
| 0.01 | 0.007 | (0.37, 0.35) |
| 0.01 | 0.009 | (0.40, 0.36) |
| 0 | 0.01 | (0.48, 0.50) |

Figure 7:
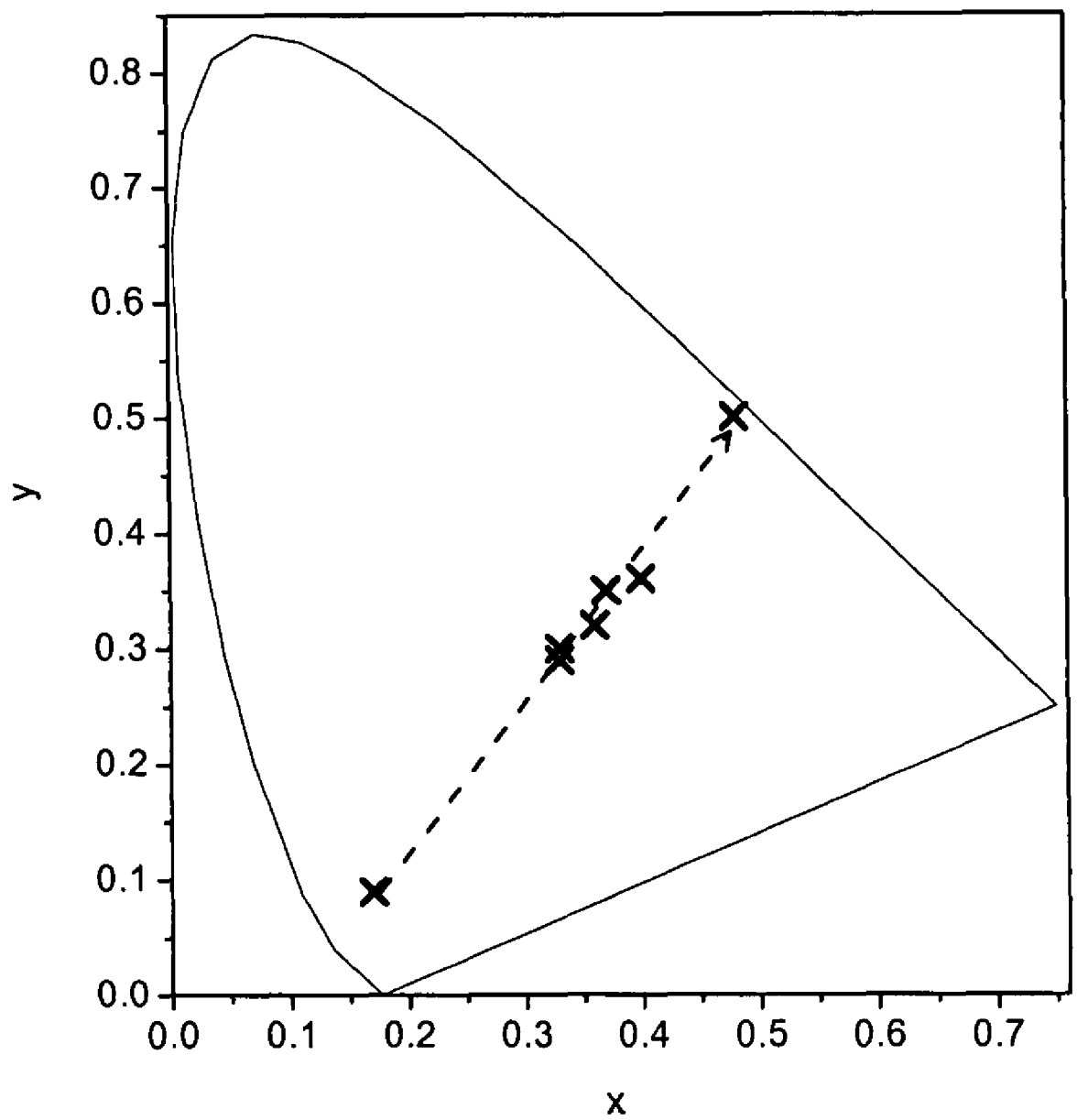
FIG. 7 shows the chromaticity coordinates of $(Ca_{1-m-n}Ce_mEu_n)_2BO_3Cl$ phosphors in a preferred embodiment of the present invention excited by wavelength at 365 nm while changing n and m values.

FIG. 7 shows the variation in chromaticity for $(M_{1-m-n}Ce_mEu_n)_2BO_3X$ phosphors excited by wavelength at 365 nm while changing relative molar ratio of $Ce^{3+}/Eu^{2+}$ ions. In the obtained chromaticity coordinates, light emitted from $(M_{1-m-n}Ce_mEu_n)_2BO_3X$ phosphor at various molar ratios of $Ce^{3+}/Eu^{2+}$ ions covers from blue to white spectral region and extends to yellow region, wherein the optimized white light with high color saturation is obtained with combination of m=0.01 and n=0.003 at CIE chromaticity coordinate of (0.33, 0.30).

Further, the present phosphor can be used in LED, particularly white LED. To achieve better color effectiveness, it can be used alone or in combination with other yellow, blue or green phosphors to display other colors.

A preferred embodiment of the present invention provides a light-emitting apparatus or lamp, said light-emitting apparatus comprises a light-emitting device which is a semiconductor light source, i.e., LED chip, and a conductive lead connected to said LED chip. The conductive lead is supported by sheet-like electrodes which provide current to the LED to enable visible light emission.

The light-emitting apparatus can comprise any blue or UV semiconductor light source which emits generated radiation to the phosphor directly to generate white light.

In a preferred embodiment of the present invention, LED can be doped with various impurities. Said LED comprises suitable III-V, II-VI or IV-IV semiconductor layers emitting radiation with wavelength at 250~500 nm. Said LED comprises at least semiconductor layer made of GaN, ZnSe or SiC. For example, a LED composed of a nitride represented by general formula $In_iGa_jAl_kN$ (wherein $0 \leq i$; $0 \leq j$; $0 \leq k$, and $I+j+k=1$) emits wavelength ranging 250 nm~500 nm. Use of the above LED semiconductor has been known conventionally and is useful as excitation source in the present invention. However, the excitation source for the present invention is not limited to the above LED, and any kind of semiconductor with excitation capability, including semiconductor laser light source, are applicable.

Generally, the mentioned LEDs are directed to inorganic ones, however, those skilled in this field can easily understand that the mentioned LEDs are replaceable by organic ones or any other radiation sources. The present phosphor is coated on said LEDs which are used as excitation source to generate white light.

Therefore, as can be seen from the above preferred embodiments, the present phosphor is capable of transforms emitting wavelength from blue into yellow to generate white light with excellent color saturation. As light generated by excited by UV to blue wavelength LED is of hue with diverse colors, in comparison to color temperature of white light generated by yellow alone YAG:Ce, it is of wider color temperature.

The present invention is disclosed above with reference to the preferred embodiments; however, the embodiments are not used as limitation of the present. It is appreciated to those in this field that the variation and modification directed to the present invention not apart from the spirit and scope thereof can be made, and the scope of the present invention is covered in the attached claims.

We claim:

1. A phosphor comprising haloborates activated by rare earth ions and represented by following general formula:

$(M_{1-m-n}Ce_mEu_n)_2BO_3X$ wherein M is at least one element selected from the group consisting of Ca, Sr and Ba, X is at least one element selected from the group consisting of Cl and Br; $0 \leq m \leq 0.5$ and $0 \leq n \leq 0.5$.

2. The phosphor according to claim 1, which can emit secondary radiation under excited by primary radiation emitted from a light-emitting device.

3. The phosphor according to claim 2, wherein wavelength of the primary radiation emitted from said light-emitting device ranges from 300 nm to 500 nm, and wavelength of the secondary radiation is longer than that of the primary radiation.

4. The phosphor according to claim 3, wherein wavelength of the primary radiation ranges from 320 nm to 370 nm, and the CIE chromaticity coordinate value (x, y) of the secondary radiation is $0.10 \leq x \leq 0.50$ and $0.08 \leq y \leq 0.60$, and wavelength of the secondary radiation transforms from blue into yellow across white region.

5. The phosphor according to claim 3, wherein when m=0, wavelength of the secondary radiation emitted from said phosphor under excited by the primary radiation ranges from 520 nm to 600 nm.

6. The phosphor according to claim 5, wherein said phosphor is excited by the primary radiation with wavelength ranges from 350 nm to 450 nm, and the CIE chromaticity coordinate value (x, y) of the resultant secondary radiation is $0.42 \leq x \leq 0.52$ and $0.40 \leq y \leq 0.60$.

7. The phosphor according to claim 3, wherein when m>0 and n>0, said phosphor is excited by the primary radiation to emit the secondary radiation comprising both blue light with wavelength at 410 nm-430 nm and yellow light with wavelength at 550 nm~570 nm, thereby white light is generated.

8. The phosphor according to claim 7, wherein said phosphor is excited by the primary radiation with wavelength ranges from 340 nm to 380 nm, and the CIE chromaticity coordinate value (x, y) of the resultant secondary radiation is $0.2 \leq x \leq 0.4$ and $0.2 \leq y \leq 0.4$.

9. A light-emitting apparatus comprising:
a light-emitting device emitting primary radiation with wavelengths at 300 nm~500 nm, and a phosphor capable of absorbing a part of the primary radiation emitted from said light-emitting device to emit secondary radiation which wavelength is different from that of the primary radiation; wherein said phosphor is selected from the phosphor according to claim 1.

10. The light-emitting apparatus according to claim 9, wherein said light-emitting device can be semiconductor light source, light-emitting diode or organic light-emitting device.

11. The light-emitting apparatus according to claim 9, wherein said phosphor is coated on the surface of said light-emitting device.

12. The light-emitting apparatus according to claim 9, wherein the wavelength of the secondary radiation emitted from said phosphor under excited is longer than that of the primary radiation emitted from said light-emitting device.

* * * * *